US010086594B2

(12) United States Patent
Horigome et al.

(10) Patent No.: US 10,086,594 B2
(45) Date of Patent: Oct. 2, 2018

(54) SHEET HAVING ADHESIVE RESIN LAYER ATTACHED THERETO, AND METHOD FOR PRODUCING SEMICONDUCTOR DEVICE

(71) Applicant: LINTEC Corporation, Tokyo (JP)

(72) Inventors: Katsuhiko Horigome, Tokyo (JP); Akinori Sato, Tokyo (JP); Yusuke Nezu, Tokyo (JP)

(73) Assignee: LINTEC Corporation, Tokyo (JP)

( * ) Notice: Subject to any disclaimer, the term of this patent is extended or adjusted under 35 U.S.C. 154(b) by 575 days.

(21) Appl. No.: 14/400,340

(22) PCT Filed: May 14, 2013

(86) PCT No.: PCT/JP2013/063379
§ 371 (c)(1),
(2) Date: Feb. 10, 2015

(87) PCT Pub. No.: WO2013/172328
PCT Pub. Date: Nov. 21, 2013

(65) Prior Publication Data
US 2015/0165743 A1 Jun. 18, 2015

(30) Foreign Application Priority Data
May 14, 2012 (JP) ................................ 2012-110644

(51) Int. Cl.
| | | |
|---|---|---|
| B32B 37/12 | (2006.01) | |
| B32B 27/08 | (2006.01) | |
| B32B 27/32 | (2006.01) | |
| B32B 37/18 | (2006.01) | |
| B32B 38/10 | (2006.01) | |
| C09J 133/08 | (2006.01) | |
| H01L 21/683 | (2006.01) | |
| H01L 23/00 | (2006.01) | |
| B32B 27/30 | (2006.01) | |
| C09J 7/38 | (2018.01) | |

(52) U.S. Cl.
CPC ............ *B32B 37/12* (2013.01); *B32B 27/08* (2013.01); *B32B 27/302* (2013.01); *B32B 27/32* (2013.01); *B32B 37/18* (2013.01); *B32B 38/10* (2013.01); *C09J 7/38* (2018.01); *C09J 133/08* (2013.01); *H01L 21/6835* (2013.01); *H01L 24/83* (2013.01); *B32B 2255/26* (2013.01); *B32B 2307/54* (2013.01); *B32B 2307/546* (2013.01); *B32B 2405/00* (2013.01); *B32B 2457/14* (2013.01); *C09J 2203/326* (2013.01); *H01L 2224/3224* (2013.01); *H01L 2224/3226* (2013.01); *H01L 2224/32145* (2013.01); *H01L 2224/8385* (2013.01); *H01L 2924/12042* (2013.01); *Y10T 428/287* (2015.01); *Y10T 428/2848* (2015.01)

(58) Field of Classification Search
None
See application file for complete search history.

(56) References Cited

U.S. PATENT DOCUMENTS

| | | | | |
|---|---|---|---|---|
| 4,049,483 A | * | 9/1977 | Loder | ................. B44C 1/1712 156/230 |
| 6,020,059 A | * | 2/2000 | Yamada | ................. C09J 7/00 428/328 |
| 6,110,552 A | * | 8/2000 | Casey | ................. B32B 27/10 428/202 |
| 6,395,360 B1 | * | 5/2002 | Takahira | ................. B32B 27/32 428/352 |
| 2003/0087038 A1 | * | 5/2003 | Su | ................. B05C 5/0254 427/420 |
| 2008/0038551 A1 | * | 2/2008 | Shintani | ................. B32B 27/32 428/354 |
| 2008/0213527 A1 | * | 9/2008 | Nonaka | ................. B32B 27/32 428/41.8 |
| 2010/0003441 A1 | * | 1/2010 | Nonaka | ................. B32B 27/32 428/40.2 |
| 2010/0099240 A1 | * | 4/2010 | Watanabe | ................. C09J 7/0217 438/464 |
| 2011/0104874 A1 | * | 5/2011 | Maeda | ................. C08F 220/18 438/464 |
| 2011/0136322 A1 | | 6/2011 | Sato et al. | |

FOREIGN PATENT DOCUMENTS

| | | |
|---|---|---|
| CN | 101490813 A | 7/2009 |
| CN | 202039018 U | 11/2011 |
| JP | 2003-138228 A | 5/2003 |
| JP | 2004-256595 A | 9/2004 |
| JP | 2004-338289 A | 12/2004 |
| JP | 2005-272724 A | 10/2005 |
| JP | 2009-138183 A | 6/2009 |
| JP | 2009164502 A | 7/2009 |

OTHER PUBLICATIONS

Machine translation of 2003-138228 (Apr. 17, 2017).*
Machine translation of 2004-256595 (Apr. 17, 2017).*
Yabuki, Akira et al., "Adhesive Tape for Semiconductor", machine translation of JP2005-272724A, published on Oct. 6, 2005.*
Asuka, Masahiro et al., "Base Material for Pressure Sensitive Adhesive Tape and Pressure Sensitive Adhesive Sheet", machine translation of JP2004-338289A, published on Dec. 2, 2004.*
English Abstract of JP 2009164502.
International application No. PCT/JP2013/063379, Notification of Transmittal of Translation of the International Preliminary Report on Patentability (Chapter I or Chapter II), dated May 14, 2013.
English Abstract of CN 202039018U.
Partial Machine translation of CN202039018U.
English Abstract of CN101490813 (A). Jul. 22, 2009.
English Abstract of JP2009138183 dated Jun. 25, 2009.
English Abstract of JP2003138228 dated May 14, 2003.
English Abstract of JP2004256595 dated Sep. 16, 2004.
English Abstract of JP2005272724 dated Oct. 6, 2005.
English Abstract of JP 2004338289 dated Dec. 2, 2004.

* cited by examiner

*Primary Examiner* — Anish P Desai
(74) *Attorney, Agent, or Firm* — Cahn & Samuels, LLP

(57) ABSTRACT

A sheet having an adhesive resin layer attached thereto includes a base and an adhesive resin layer laminated on the base. The rate of shrinkage of the base in each of an MD direction and a CD direction after the heating of the sheet at 70° C. for 1 minute is −0.5 to 0.5% and the bending resistance of the base is 80 mm or more.

13 Claims, No Drawings

SHEET HAVING ADHESIVE RESIN LAYER ATTACHED THERETO, AND METHOD FOR PRODUCING SEMICONDUCTOR DEVICE

This application is a U.S. national stage application of PCT/JP2013/063379 filed on 14 May 2013, and claims priority to Japanese patent document 2012-110644 filed on 14 May 2012, the entireties of which are incorporated herein by reference.

TECHNICAL FIELD

The present invention relates to a sheet having an adhesive resin layer particularly suitable when using for a step of picking up a chip form component (the semiconductor chip), or for a step of picking up the chip form component and die bonding the chip form component to an organic base, a lead flame, and other chip form component or so. Also, the present invention relates to the production method of the semiconductor device using said sheet.

DESCRIPTION OF THE RELATED ART

As the information terminal apparatus rapidly becomes thinner, more compact, and multi-functionalized, the semiconductor devices mounted thereon is also demanded to be thinner and to become densified. Particularly, for the memory chip, the silicon wafer is processed extremely thin to be multilayered, thereby higher capacity is attained.

In response to such trend of the semiconductor device, for the semiconductor processing, the method of processing to make extremely thin wafer is the key; hence various thinning processing methods are thought and evaluated. As such thinning processing method, the method of forming the groove with the predetermined depth from the wafer surface side, then grinding from the backside thereof to produce the semiconductor chip is disclosed. Such process is called "Pre-dicing method".

In the pre-dicing method, the protection sheet is adhered to the wafer surface, then the wafer is made into a chip in the middle of the backside grinding of the wafer. Therefore, in order to prevent the washing water used during the grinding from entering between the chips, for the used protection sheet, it is necessary to have excellent adhesiveness against the wafer surface. As such, if the tackiness of the protection sheet is enhanced in order to adhere to the circuit face of the wafer, then there is a tendency that many adhesive agent residues remains at the circuit face of after releasing; thus in the pre-dicing method, it is necessary to particularly suppress the adhesive agent residue from forming.

Patent article 1 discloses to use the adhesive sheet comprising the specific energy ray curing adhesive agent layer in order to suppress the generation of the adhesive agent residue in the pre-dicing method.

Also, as for other method to suppress the generation of the adhesive agent residue in the pre-dicing method, there is also the method of releasing the protection sheet by lowering the adhesiveness of the protection sheet by heat applying step. When releasing the protection sheet, the die bonding sheet comprising the base and the die bonding agent layer for adhering the chip, and the adhesive sheet comprising the base and the adhesive agent layer for carrying out the pickup are adhered to the opposite face of the face of which the protection sheet is adhered.

PRIOR ART

Patent Article

[Patent Article 1] JP Paten Application Laid Open No. 2009-138183

However, during the heat applying step for releasing the protection sheet, the die bonding sheet or the adhesive sheet both are heated, then in some case the base of the die bonding sheet or the adhesive sheet shrunk. Along with the shrinking of the base, the die bonding agent layer or the adhesive agent layer of said sheet deform and becomes difficult to maintain the alignment of the chip. As a result, the chips contacts against each other and chip may be damaged, and the pickup property of the chip may be lowered.

Further, in case the adhesive sheet is adhered when the protection sheet is released, in such case it may take a method wherein the die bonding adhesive agent is applied with heat to soften then to adhere the chip; thus there may be a chance that the same problem may occur as the case when heat is applied to the protection sheet as discussed in the above.

The present invention is achieved in view of such circumstances, and its object is to provide the sheet having the adhesive resin layer capable of transferring the chip form component while maintaining the alignment of the chip form component. Also, its object is to provide the production method of the semiconductor device using the sheet.

SUMMARY OF INVENTION

The gist of the present invention is as follows.

[1] A sheet having an adhesive resin layer, which comprises a base and an adhesive resin layer stacked on said base, wherein a shrinkage of the base in MD direction and CD direction after one minute heat applying at 70° C. is −0.5 to 0.5%, and a bending resistance of the base is 80 mm or more.

[2] The sheet having the adhesive resin layer as set forth in [1], wherein a product between Young's modulus of the base and the thickness of the base is $1.0 \times 10^5$ N/m or less.

[3] The sheet having the adhesive resin layer as set forth in [1] or [2], wherein the base is a multilayered laminate comprising a low density polyethylene film and a polypropylene film.

[4] The sheet having the adhesive resin layer as set forth in any one of [1] to [3], wherein said base is the multilayered laminate stacking a low density polyethylene film, a polypropylene film and a low density polyethylene film in this order.

[5] The sheet having the adhesive resin layer as set forth in any one of [1] to [4], wherein the adhesive resin layer is a resin coat forming layer.

[6] The sheet having the adhesive resin layer as set forth in [5], wherein the resin coat forming layer includes a binder polymer component (A) and a curable component (B).

[7] The sheet having the adhesive resin layer as set forth in [5] or [6], wherein the resin coat forming layer has a thermal bonding property.

[8] The sheet having the adhesive resin layer as set forth in any one of [5] to [7], wherein the resin coat forming layer is stacked on the base via a re-releasable attaching layer.

[9] The sheet having the adhesive resin layer as set forth in any one of [1] to [4], wherein the adhesive resin layer is a pressure-sensitive adhesive layer.

[10] A production method of a semiconductor device comprising;
a step of adhering a chip form component to the adhesive resin layer of the sheet having the adhesive resin layer as set forth in any one of [1] to [9], and
a step of picking up the chip form component.

[11] A production method of a semiconductor wafer comprising;
a step of adhering a chip form component to the adhesive resin layer of the sheet having the adhesive resin layer as set forth in any one of [5] to [8],
a step of releasing the adhesive resin layer from the base while transferring the adhesive resin layer to a backside of the chip form component, and
a step of placing the chip form component on a die pad part or other chip form component via the adhesive resin layer.

According to the sheet having the adhesive resin layer of the present invention, the chip form component can be transferred while maintaining the alignment of the chip form component. Also, the sheet having the adhesive resin layer of the present invention comprises an excellent expanding property. As a result, the pickup property of the chip form component is excellent as well. Also, the adhesive resin layer can be easily divide into a size of the chip form component due to the expanding; hence the chip form component having the adhesive resin layer at the backside can be obtained easily, and the production steps of the semiconductor device can be simplified.

DETAILED DESCRIPTION OF INVENTION

Hereinafter, the present invention will be explained in detail including its best embodiment. The sheet having the adhesive resin layer according to the present invention comprises the base, and the adhesive resin layer stacked on the base.
(The Base)
In the base of the present invention, the shrinkage of MD direction (flow direction) and CD direction (width direction) of the base after one minute heat applying at 70° C. is −0.5 to 0.5%, and preferably −0.4 to 0.4%, and more preferably −0.3 to 0.3%. The shrinkage of the base after one minute heat applying at 70° C. is a characteristic value measured by a thermomechanical analysis apparatus, and specifically it is measured in a step described in the following examples.

In the adhesive resin layer of the sheet having the adhesive resin layer according to the present invention, the chip form component (for example, the semiconductor wafer made into a chip) is adhered; then the pickup is carried out. When the adhesive resin layer is adhered to the chip form component, the adhesiveness to the chip form component may be enhanced by softening the adhesive resin layer by applying a heat. Specifically, the step of adhering accompanying the heat is carried out usually at 40 to 90° C.

Also, the chip form component is separated while being adhered to the supporting body for the chip form component processing such as dicing tape or the surface protection sheet; thus when the adhesive resin layer is adhered to the chip form component, the supporting body for the chip form component processing is also adhered to the adhesive resin layer via the chip form component. The supporting body for the chip form component processing needs to be released when carrying out the subsequent step (for example the pickup step or so), and in order to do so, while applying the heat (40 to 90° C.) to the supporting body for the chip form component processing, the tacky force may be lowered which is the force between the chip form component and the supporting body for the chip form component processing. In this step, the subject of the heat applying is the supporting body of the chip form component processing, however the heat is also passed to the sheet having the adhesive sheet resin layer via the chip form component.

In case the shrinkage of the base is less than −0.5%, or in case it exceeds 0.5%, then the adhesive resin layer also deforms along with the deformation of the base due to the heat, and the alignment of the chip form component adhered to the adhesive resin layer is lowered. Therefore, the pickup malfunction caused by the position identifying error during the pickup step of the chip form component may occur, or there may be a risk that the chip form component contacts against each other, and may cause trouble at the subsequent steps. By setting the shrinkage of the base within the above range, when the chip form component is adhered to the adhesive resin layer, or even after going through the heat applying step for releasing the supporting body for the chip form component processing and the chip form component; the shrinkage of the base is suppressed, thus the alignment of the chip form component can be maintained. As a result, the pickup malfunction can be prevented which is caused by the shifting of the chip position during the pickup step which will be described in the following.

Also, the bending resistance of the base is 80 mm or more, preferably 90 mm or more, and more preferably 95 to 120 mm. If the bending resistance of the base is less than 80 mm, then the pickup property of the chip form component declines. By having the bending resistance of the base within the above range, the pickup property of the chip form component becomes excellent.

Also, the product between Young's modulus of the base and the thickness of the base is preferably $1.0 \times 10^5$ N/m or less, more preferably $5.0 \times 10^4$ N/m or less, and more preferably $6.0 \times 10^3$ to $4.0 \times 10^4$ N/m. By setting the product between Young's modulus of the base and the thickness of the base within the above mentioned range, a good expanding property of the base can be obtained. Also, when the sheet having the adhesive resin layer of the present invention is adhered to the chip form component, the stress generated at the sheet having the adhesive resin layer is suppressed, and the alignment of the chip form component is improved.

Here, Young's modulus of the base is preferably 80 to 800 MPa, more preferably 100 to 500 MPa, and further preferably 150 to 500 MPa. Also, the thickness of the base is preferably 40 to 200 μm, more preferably 50 to 175 μm, and further preferably 60 to 150 μm. The base of the present invention is preferably selected by taking Young's modulus and the thickness thereof into consideration, so that the product between Young's modulus of the base and the thickness of the base is within the above range. For example, as it will be discussed in below, in case of the multilayered laminate wherein the base comprises low density polyethylene film (LPDL) and polypropylene film (PP), by comprising softening component in the resin when coating polypropylene film, the base having the above physical property can be obtained.

As for the softening component, vinyl aromatic hydrocarbon-conjugated diene hydrocarbon copolymer and the hydrogenated product thereof may be mentioned, and the hydrogenated product of vinyl aromatic hydrocarbon-conjugated diene hydrocarbon copolymer is preferable.

Vinyl aromatic hydrocarbon refers to aromatic hydrocarbon comprising at least one vinyl group, and for example; styrene, α-methylstyrene, p-methylstyrene, divinylbenzene, 1,1-diphenylethylene, N,N-dimethyl-p-aminoethylstyrene, N,N-diethyl-p-aminoethylstyrene or so may be mentioned. These may be used alone or by combining two or more thereof. Among these, styrene is preferably.

Also, conjugated diene hydrocarbon refers to diolefin comprising a pair of conjugated double bond, and for example 1,3-butadiene, 2-methyl-1,3-butadiene (isoprene), 2,3-dimethyl-1,3-butadiene, 1,3-pentadiene, 2-methyl-1,3-pentadiene, 1,3-hexadiene or so may be mentioned. These may be used alone or by combining two or more thereof. Among these, butadiene is preferable. The content ratio of the softening component in the resin for coating polypropylene film is preferable 10 to 30 wt %.

The base used for the sheet having the adhesive resin layer of the present invention is not particularly limited as long as the above mentioned physical properties are satisfied, however preferably it is a multilayered laminate comprising low density polyethylene film and polypropylene film; and more preferably it is the multilayered laminate wherein low density polyethylene film, polypropylene and low density polyethylene film are stacked in this order.

Low density polyethylene film has excellent flexibility, but it has large shrinkage due to the heat. On the other hand, polypropylene film has low shrinkage due to the heat, however it has low flexibility. Therefore, by stacking low density polyethylene film and polypropylene film, the base having excellent flexibility and small shrinkage by the heat can be obtained; and the shrinkage and the bending resistance of the base can be regulated to the above mentioned range. Also, since the pickup property of the chip form component can be improved, it is preferable to provide the adhesive resin layer at low density polyethylene film side having excellent flexibility. Also, by stacking low density polyethylene film, polypropylene and low density polyethylene film in this order, the base can be prevented from curing up, hence excellent handling property can be obtained.

The ratio between the total thickness of low density polyethylene film and the total thickness of polypropylene film is preferably 5:95 to 40:60, more preferably 10:90 to 32.5:67.5. By setting as the above mentioned ratio, the shrinkage and the bending resistance of the base can be easily set within the above mentioned range.

Also, at the face where the base contacts the adhesive resin layer, in order to improve the wettability, other layer such as a primer layer carried out with corona treatment may be provided.

(The Adhesive Resin Layer)

The adhesive resin layer of the present invention is preferably a resin coat forming layer or a pressure sensitive adhesive agent layer. In case the adhesive resin layer is formed by the resin coat forming layer, the sheet having the adhesive resin layer according to the present invention can be used as pickup-die bonding sheet or pickup-protection coat forming sheet. Also, in case the adhesive resin layer is formed by the pressure sensitive adhesive agent layer, the sheet having the adhesive resin layer can be used as the pickup sheet. As for the specific using method of the sheet having the adhesive resin layer according to the present invention, it will be explained during the following production method of the semiconductor device.

(The Resin Coat Forming Layer)

The resin coat forming layer is a layer for forming the resin coat to the adherend by being released from the base, and specifically, a binder polymer component (A) and a curable component (B) are preferably included. Note that, at the resin coat forming layer, in order to improve various physical properties, other components may be blended depending on the needs. Hereinafter, these components will be explained.

(A) The Binder Polymer Component

In order to provide sufficient adhesiveness and the film forming property (the sheet forming property) to the adhesive resin layer, the binder polymer component (A) is used. As for the binder polymer component (A), those conventionally known such as acrylic polymer, polyester resin, urethane resin, acrylic urethane resin, silicone resin, phenoxy resin, rubber based polymer or so can be used.

The weight average molecular weight (Mw) of the binder polymer component (A) is preferably 10,000 to 2,000,000, and more preferably 100,000 to 1,500,000. If the average molecular weight of the binder polymer component (A) is too low, the release force between the resin coat forming layer and the base becomes high, the transfer malfunction of the resin coat forming layer may occur; and if it is too high, then the adhesiveness of the resin coat forming layer declines, thus the chip form component may not be transferred or the resin coat forming layer may be released from the chip form component after the transfer.

As for the binder polymer component (A), acrylic polymer is preferably used. The glass transition temperature (Tg) of the acrylic polymer is preferably −60 to 50° C., more preferably −50 to 40° C., and particularly −40 to 30° C. If the glass transition temperature of the acrylic polymer is too low, the transfer malfunction of the resin coat forming layer may occur as the release force between the resin coat forming layer and the base becomes too big; and if it is too high, the adhesiveness of the resin coat layer declines, thus the chip form component may not be transferred or the resin coat forming layer may be released from the chip form component after the transfer.

As the monomer constituting the above mentioned acrylic polymer, (meth)acrylate monomer or the derivatives thereof may be mentioned. For example, alkyl (meth)acrylate having the alkyl group of carbon atoms of 1 to 18, specifically, methyl (meth)acrylate, ethyl (meth)acrylate, propyl (meth)acrylate, butyl (meth)acrylate, 2-ethylhexyl (meth)acrylate or so may be mentioned. Also, (meth)acrylate having a cyclic backbone, specifically cyclohexyl (meth)acrylate, benzyl (meth)acrylate, isobornyl (meth)acrylate, dicyclopentanyl (meth)acrylate, dicyclopentenyl (meth)acrylate, dicyclopentenyloxyethyl (meth)acrylate, imide (meth)acrylate or so may be mentioned. The (meth)acrylate comprising the hydroxyl group, specifically 2-hydroxyethyl (meth)acrylate, 2-hydroxypropyl (meth)acrylate or so may be mentioned. Other than these, glycidyl (meth)acrylate having epoxy group or so may be mentioned. Among these, the acrylic polymer comprising the monomer with the hydroxyl group is preferable since it has good compatibility with the curable component (B) which will be discussed in the following. Also, the above mentioned acrylic polymer may be copolymerized with acrylic acid, methacrylic acid, itaconic acid, vinyl acetate, acrylonitrile, styrene or so.

Further, as the binder polymer component (A), the thermoplastic resin may be blended. The thermoplastic resin is a polymer excluding acrylic polymer, and it is blended in order to maintain the flexibility of the resin coat forming layer of after curing. As such thermoplastic resin, those having the weight average molecular weight of 1000 to 100000 is preferable, and more preferably it is 3000 to 80000. By comprising the thermoplastic resin within the above range, the release between the base and the resin coat forming layer during the transferring of the chip form component can be carried out easily, and further the resin coat forming layer follows the transferred face thus the void or so is suppressed from being generated.

The glass transition temperature of the thermoplastic resin is preferably −30 to 150° C., and more preferably −20 to 120° C. When the glass transition temperature is too low, the release force between the resin coat forming layer and the base becomes large, and there may be a transfer malfunction of the resin coat forming layer; and if it is too high, the adhesive force between the resin coat forming layer and the chip form component may become insufficient.

As the thermoplastic resin, polyester resin, urethane resin, acrylic urethane resin, phenoxy resin, silicone resin, polybutene, polybutadiene, polystyrene or so may be mentioned. These may be used alone or by combining two or more thereof.

In case the thermoplastic resin is comprised, it is included by the fraction of usually 1 to 60 parts by weight, preferably 1 to 30 parts by weight with respect to total 100 parts by weight of the binder polymer component (A). When the content of the thermoplastic resin is within this range, the above mentioned effect can be obtained.

Also, as the binder polymer (A), the polymer having the energy ray polymerizable group at the side chain can be used as well. As the energy ray polymerizable group, those same as the energy ray polymerizable functional group comprised in the energy ray polymerizable compound which will be described in below may be used. As for the polymer comprising the energy ray polymerizable group at the side chain, for example the polymer prepared by reacting the polymer comprising the reactive functional group X at the side chain with the low molecular weight compound comprising the energy ray polymerizable group and the functional group Y capable of reacting the reactive functional group X may be mentioned.

(B) The Curable Component

As the curable component (B), the thermosetting component and heat curing agent, or the energy ray polymerizable compound may be used. Also, these may be combined for use. As for the thermosetting component, for example epoxy resin is preferable.

As the epoxy resin, conventionally known epoxy resin can be used. As the epoxy resin, specifically, epoxy compound having two or more functional groups in the molecule such as polyfunctional epoxy resin, biphenyl compound, bisphenol A diglycidylether and the hydrogenated product thereof, orthocresol novolac epoxy resin, dicyclopentadiene type epoxy resin, biphenyl type epoxy resin, bisphenol A type epoxy resin, bisphenol F type epoxy resin, phenylene backbone type epoxy resin or so may be mentioned. These may be used alone or by combining two or more thereof.

In case of using the thermosetting component and heat curing agent as the curable component (B), the thermosetting component is included in the resin coat forming layer by 1 to 1500 parts by weight, and more preferably 3 to 1200 parts by weight with respect to 100 parts by weight of binder polymer component (A). When the content of the thermosetting component is less than 1 part by weight, sufficient adhesiveness may not be obtained; and if it exceeds 1500 parts by weight, the release force between the resin coat forming layer and the base increases, thus the transfer malfunction of the resin coat forming layer may occur.

The heat curing agent functions as the curing agent against the thermosetting component, particularly against epoxy resin. As preferable heat curing agent, the compound having two or more functional groups capable of reacting with the epoxy group in one molecule may be mentioned. As such functional group, phenolic hydroxyl group, alcoholic hydroxyl group, amino group, carboxyl group, acid anhydride or so may be mentioned. Among these, preferably phenolic hydroxyl group, amino group, acid anhydride or so may be mentioned, and further preferably phenolic hydroxyl group and amino group may be mentioned.

As specific examples of the phenol based curing agent, polyfunctional phenol resin, biphenol, novolac phenol resin, dicyclopentadiene phenol resin, XYLOK phenol resin, aralkyl phenol resin or so may be mentioned. As for specific examples of amine curing agent, DICY (dicyandiamide) may be mentioned. These may be used alone or by mixing two or more thereof.

The content of the heat curing agent is preferably 0.1 to 500 parts by weight, and more preferably 1 to 200 parts by weight with respect to 100 parts by weight of the heat curing component. If the content of the heat curing agent is too little, the adhesiveness may not be obtained due to the insufficient curing, and if it too much, then the moisture absorbing rate of the resin coat forming layer increases which lowers the reliability of the semiconductor device.

As the energy ray curable component, the energy ray polymerizable group is included and polymerize cure when the energy ray such as ultraviolet ray and the electron beam or so are irradiated. As such energy ray curable component, specifically an acrylate based compound such as trimethylolpropanetriacrylate, pentaerythritoltriacrylate, pentaerythritoltetraacrylate, dipentaerythritolmonohydroxypentaacrylate, dipentaerythritolhexaacrylate or 1,4-butyleneglycoldiacrylate, 1,6-hexanedioldiacrylate, polyethyleneglycoldiacrylate, oligoesteracrylate, urethaneacrylate oligomer, epoxy modified acrylate, polyetheracrylate and itaconic acid oligomer or so may be mentioned. Such compounds comprise at least one polymerizable double bond in the molecule, and usually the weight average molecular weight is 100 to 30000, preferably 300 to 10000 or so. In case of using the energy ray polymerizable compound as the curable component (B), in the resin coat forming layer, preferably 1 to 1500 parts by weight, more preferably 3 to 1200 parts by weight of the energy ray polymerizable compound is included with respect to 100 parts by weight of the binder polymer component (A).

Other Components

The resin coat forming layer can include following components in addition to the above mentioned binder polymer component (A) and the curable component (B).

(C) The Coloring Agents

The coloring agents can be blended in the resin coat forming layer. By blending the coloring agent, when the semiconductor device is incorporated to the machine, the malfunction of the semiconductor device caused by the infrared ray generated in the surrounding device can be prevented. As the coloring agent, organic or inorganic pigment or die are used. Among these, the black pigment is preferable from the point of blocking the electromagnetic wave or infrared ray. As for the black pigment, carbon black, iron oxide, manganese dioxide, aniline black, and activated carbon or so may be used, but it is not limited thereto. The carbon black is particularly preferable from the point of improving the reliability of the semiconductor device. The blending amount of the coloring agent (C) is preferably 0.1 to 35 parts by weight, more preferably 0.5 to 25 parts by weight, and most preferably 1 to 15 parts by weight with respect to 100 parts by weight of entire solid portion constituting the resin coat forming layer.

(D) The Heat Curing Catalyst

The heat curing catalyst (D) is used to control the curing speed of the resin coat film forming layer. The heat curing catalyst (D) is preferably used when used together with epoxy resin and the heat curing agent, in case at least the thermosetting component and the heat curing agent are used.

As the preferable heat curing catalyst, a tertiary amines such as triethylene diamine, benzyl dimethyl amine, triethanol amine, dimethylaminoethanol, tris(dimethylaminomethyl) phenol or so; imidazols such as 2-methylimidazol, 2-phenylimidazol, 2-phenyl-4-methylimidazol, 2-phenyl-4,5-dihydroxymethylimidazol, 2-phenyl-4-methyl-5-hydroxymethylimidazol or so; organic phosphine such as tributylphosphine, diphenylphosphine, triphenylphosine or so; tetraphenylboron salt such as tetraphenylphosphoniumtetraphenylborate, triphenylphosphinetetraphenylborate or so may be mentioned. These may be used alone or by mixing two or more thereof.

The heat curing catalyst (D) is included preferably within the range of preferably 0.01 to 10 parts by weight, more preferably 0.1 to 1 parts by weight, with respect to 100 parts by weight of total amount of the thermosetting component and the heat curing agent. By comprising the heat curing catalyst (D) in the amount described in above range, it has excellent adhesive characteristic even if it is exposed under the high temperature high humidified condition; and also even if it is exposed to a harsh reflow condition, a high reliability can still be attained. If the content of the heat curing catalyst (D) is too little, a sufficient adhesive characteristic may not be obtained due to the insufficient curing, and if it is too much, then the heat curing catalyst having high polarity moves to the bonding boundary side in the resin coat forming layer under a high temperature high humidified condition, which causes the reliability of the semiconductor device to decline due to the segregation.

(E) The Coupling Agent

The coupling agent (E) is a compound comprising, in one molecule, the functional group capable of reacting with the organic reactive group comprised in the component constituting the resin coat forming layer, and the functional group capable of reacting with the inorganic surface (for example, the surface of the chip form component); and it is used to improve the adhesiveness and the bonding property against the chip form component of the resin coat layer. As for the functional group capable of reacting with the inorganic surface, alkoxy group or acetoxy group or so may be mentioned. Also, as the coupling agent (E), the compound comprising the functional group reacting with the organic functional group comprised in the binder polymer (A) and the curable component (B) or so are preferably used. As for the coupling agent (E), silane coupling agent is preferable. As for silane coupling agent, γ-glycidoxypropyltrimethoxy silane, γ-glycidoxypropylmethyldiethoxy silane, β-(3,4-epoxycyclohexyl)ethyltrimethoxy silane, γ-(methacryloxypropyl)trimethoxy silane, γ-aminopropyltrimethoxy silane, N-6-(aminoethyl)-γ-aminopropyltrimethoxy silane, N-6-(aminoethyl)-γ-aminopropylmethyldiethoxy silane, N-phenyl-γ-aminopropyltrimethoxy silane, γ-ureidepropyltriethoxy silane, γ-melcaptopropyltrimethoxy silane, γ-melcaptopropylmethyldimethoxy silane, bis(3-triethoxysilylpropyl)tetrasulphone, methyltrimethoxy silane, methyltriethoxy silane, vinyltrimethoxy silane, vinyltriacetoxy silane, imidazol silane or so may be mentioned. These may be used alone or by mixing two or more thereof.

The coupling agent (E) is included usually by 0.1 to 20 parts by weight, preferably 0.2 to 10 parts by weight and more preferably 0.3 to 5 parts by weight with respect to 100 parts by weight of total of the binder polymer component (A) and the curable component (B). If the content of the coupling agent (E) is less than 0.1 parts by weight, there is a chance that the above mentioned effect cannot be obtained, and if it exceeds 20 parts by weight, it may become a cause of generating the outgas.

(F) The Photopolymerization Initiator

In case the resin coat forming layer comprises the energy ray curable component as the aforementioned curable component (B), upon using, the energy ray such as ultra violet ray or so is irradiated to cure the energy ray curable component. At this time, by comprising the photopolymerization initiator (F) in said composition, it can reduce the time for polymerizing and curing, and also the photo irradiation amount.

As specific examples of such photopolymerization initiator (F), benzophenone, acetophenone, benzoin, benzoinmethylether, benzoinethylether, benzoinisopropylether, benoinisobutylether, benzoin benzoic acid, benzoin methyl benzoic acid, benzoindimethylketal, 2,4-diethylthioxanthone, α-hydroxycyclohexylphenylketone, benzyldiphenylsulphide, tetramethylthiurammonosulphide, azobisisobutyronitrile, benzil, dibenzil, diacetyl, 1,2-diphenylmethane, 2-hydroxy-2-methyl-1-[4-(1-methylvinyl)phenyl]propanone, 2,4,6-trimethylbenzoyldiphenylphosphineoxide, and β-chloranthraquinone or so may be mentioned. The photopolymerization initiator (F) may be used alone or by combining two or more thereof.

The content ratio of the photopolymerization initiator (F) is preferably included by 0.1 to 1-parts by weight, and 1 to 5 parts by weight with respect to 100 parts by weight of the energy ray polymerizable compound. If it is less than 0.1 parts by weight, the photopolymerization may be insufficient thus the sufficient transfer property may not be obtained; and if exceeds 10 parts by weight, then residuals which does not contribute to the photopolymerization may be generated, and the resin coat forming layer may be insufficiently cured.

(G) The Inorganic Filler

By blending the inorganic filler (G) in the resin coat forming layer, it becomes possible to control the heat expansion coefficient of after the curing, thus the heat expansion coefficient of the resin coat forming layer after the curing is optimized with respect to the chip form component; thereby the reliability of the semiconductor device can be improved. Also, the moisture absorbing rate of the resin coat forming layer after the curing can be reduced as well.

As the preferable inorganic filler, powders such as silica, alumina, talc, calcium carbonate, titanium white, red iron oxide, silicon carbide, boron nitride or so, a beads of which these has been made into spherical form, a single crystal fiber and glass fiber or so may be mentioned. Among these, silica filler is preferable. The above mentioned inorganic filler (G) may be used alone or by mixing two or more thereof. The content of the inorganic filler (G) is adjustable within the range of usually 1 to 80 parts by weight with respect to 100 parts by weight of the entire solid portion constituting resin coat film forming layer.

(H) The Crosslinking Agent

The crosslinkling agent may be added in order to control the initial bonding force and the aggregation force of the resin coat forming layer. As for the crosslinking agent (H), organic polyvalent isocyanate compound, organic polyvalent imine compound or so may be mentioned.

As for the organic polyvalent isocyanate compound, aromatic polyvalent isocyanate compound, aliphatic polyvalent isocyanate compound, alicyclic polyvalent isocyanate compound and the trimer of the organic polyvalent isocyanate compound thereof, and terminal isocyanate urethane prepolymer obtained by reacting these organic polyvalent isocyanate compounds and the polyol, may be mentioned.

As for the organic polyvalent isocyanate compound, specifically, 2,4-tolylenediisocyanate, 2,6-tolylenediisocyanate, 1,3-xylenediisocyanate, 1,4-xylenediisocyanate, diphenylmethane-4,4'-diisocyanate, diphenylmethane-2,4'-diisocyanate, 3-methyldiphenylmethanediisocyanate, hexamethylenediisocyanate, isophoronediisocyanate, dicyclohexylmethane-4,4'-diisocyanate, dicyclohexylmethane-2-4'-diisocyanate, trimethylolpropane adduct tolylenediisocyanate, and lysine isocyanate or so may be mentioned.

As for the organic polyvalent imine compounds, N-N'-diphenylmethane-4,4'-bis(1-aziridinecarboxyamide), trimethylolpopane-tri-β-aziridinylpropionate, tetramethylolmethane-tri-β-aziridinylpropionate, and N,N'-toluene-2,4-bis(1-aziridinecarboxyamide) triethylenemelamine or so may be mentioned.

The crosslinking agent (H) is used in the ratio of usually 0.01 to 20 parts by weight, preferably 0.1 to 10 parts by weight, and more preferably 0.5 to 5 parts by weight with respect to 100 parts by weight of the binder polymer component (A).

(I) General Additives

Various additives may be blended depending on the needs, into the resin coat forming layer besides the above described. As for the various additives, a leveling agent, a plasticizer, an antistatic agent, an antioxidant, an ion scavenger, a gettering agent, a chain transfer agent or so may be mentioned.

The resin coat forming layer preferably comprise above mentioned various components, and has adhesiveness (for example, a thermal bonding property and a pressure sensitive adhesiveness) and the curability, further it comprises the function to temporary hold the chip form component such as semiconductor chip or so under it is un-cured state. Also, by going through the curing, at the end a cured product having high impact resistance can be provided, further has excellent balance between the shear strength and release strength, and can maintain a sufficient adhesiveness under harsh hot and humid condition.

The resin coat forming layer preferably comprises heat bonding property. That is, under usual temperature, it does not show a pressure sensitive adhesiveness, however it preferably is capable to adhere to the adherend when softened by heat. As it will be discussed in below, in the production method of the semiconductor device using the sheet having the adhesive resin layer comprising the resin coat forming layer, in some cases, after the chip form component is placed on the chip mounting part, it is temporary adhered without carrying the heat treatment, then the resin coat forming layer is cured using the heat applying of the resin sealing which is usually carried out during the package production. In case such process is employed, the resin coat forming layer is uncured during the wire bonding step. In case the resin coat forming layer has flexibility which allows having the pressure sensitive adhesiveness at the usual temperature, then there is a risk that the temporary adhered chip form component shifts from the position of the chip mounting part due to the impact during the wire bonding. Therefore, from the point of preventing such problem, as the resin coat forming layer, those having the thermal bonding property with low flexibility at the usual temperature are preferably used.

Also, in case the resin coat forming layer which will be described in the following are stacked on the base via the re-releasable attaching layer, the resin coat forming layer may adhere with there-releasable attaching layer if the resin coat forming layer comprises the pressure sensitive adhesiveness, and it tends to become difficult to pick up, hence the resin coat forming layer preferably comprises the thermal bonding property.

(The Pressure Sensitive Adhesive Agent Layer)

The adhesive resin layer of the sheet having the adhesive resin layer can be the pressure sensitive adhesive agent layer which is not for the releasing from the base.

The pressure sensitive adhesive agent layer can be formed by the conventionally known various pressure sensitive adhesive agent. As for the pressure sensitive adhesive agent, it is not particularly limited, however for example the adhesive agents such as rubber based, acrylic based, silicone based, polyvinylether based or so may be used. Among these, the acrylic based adhesive agent is particularly preferable since it is easy to control the adhesive force. These adhesive agents can be used alone or by combining two or more thereof.

The acrylic based adhesive agent has (meth)acrylate copolymer as the main component. As (meth)acrylate copolymer, the copolymer between a monomer of one or more of (meth)acrylate wherein ester structure is added to the hydrocarbon such as methyl acrylate, ethyl acrylate, propyl acrylate, butyl acrylate, 2-ethyl hexyl acrylate, decyl acrylate, dodecyl acrylate, lauryl acrylate, myristyl acrylate, methyl methacrylate, ethyl methacrylate, propyl methacrylate, butyl methacrylate, benzyl acrylate, cyclohexyl acrylate, isobornyl acrylate, with depending on needs, one or more monomers selected from the polymerizable monomers such as hydroxyl group containing (meth)acrylate such as 2-hydroxyethyl acrylate, 2-hydroxypropyl acrylate, 3-hydroxypropyl acrylate, 3-hydroxybutyl acrylate, 4-hydroxybutyl acrylate, 2-hydroxyethyl methacrylate, 2-hydroxypropyl methacrylate, 2-hydroxypropyl methacrylate, 3-hydroxypropyl methacrylate, 3-hydroxybutyl methacrylate, 4-hydroxybutyl methacrylate or so; carboxyl group containing compound such as acrylic acid, methacrylic acid, maleic acid, phthalic acid or so; vinyl esters such as vinyl acetate, vinyl propionate or so; cyano group containing compound such as acrylonitrile, methacrylonitrile or so; amide group containing compound such as acrylic amide or so; aromatic carbons such as styrene, vinyl pyridine or so may be mentioned. Note that, when the polymerizable monomer is only one, it is not a copolymer strictly speaking, however it will be called as copolymer including such case.

The content ratio of the unit derived from (meth)acrylate wherein ester structure is added to the hydrocarbon of (meth)acrylate copolymer is preferably 10 to 98 wt %, more preferably 20 to 95 wt %, and further preferably 50 to 93 wt %. The weight average molecular weight of (meth)acrylate copolymer is 100,000 to 2,500,000, more preferably 200,000 to 1,500,000, and particularly preferably 300,000 to 1,000,000. Note that, in the present specification, the weight average molecular weight is a polystyrene corresponding value measured by the gel permeation chromatography method.

These (meth)acrylate copolymer can be used alone or by combining two or more thereof. Also as (meth)acrylate copolymer, the acrylic based adhesive agents obtained by crosslinking one or more of crosslinking agent such as the acrylic based copolymer with polyisocyanate based crosslinking agent, epoxy based crosslinking agent, aziridine based crosslinking agent, chelate based crosslinking agent or so.

As epoxy based crosslinking agent, (1,3-bis(N,N-diglycidylaminomethyl)cyclohexane, N,N,N',N'-tetraglycidyl-m-xylenediamine, N,N,N',N'-tetraglycidylaminophenylmethane, triglycidylisocyanate, m-N,N- diglycidylaminophenylglycidylether, N,N-diglycidyltoluidine, N,N-diglycidylaniline, pentaerythritolpolyglycidylether, 1,6-hexanediolglycidylether or so may be mentioned.

As for polyisocyanate based crosslinking agent, tolylenediisocyanate (TDI), hexamethylenediisocyanate (HMDI), isophoronediisocyanate (IPDI), xylenediisocyanate (XDI), hydrogenated tolylenediisocyanate, diphenylmethanediisocyante and the hydrogenates thereof, polymethylenepolyphenylpolyisocyanate, naftylene-1,5-diisocyanate, polyisocyanate prepolymer, polymethylolpropane modified TDI or so may be mentioned.

The crosslinking agent may be used alone or two or more thereof may be combined. The used amount of the crosslinking agent is 0.01 to 20 parts by weight with respect to 100 parts by weight of acrylic ester copolymer.

Further, in case the sheet having the adhesive resin layer is used as the pickup sheet, the pressure sensitive adhesive agent layer may be formed by the adhesive agent layer capable of controlling the adhesive force by the energy ray curing, heat foaming, and water swelling or so. Also, the energy ray curable type adhesive agent layer can be formed by various energy ray curable type adhesive agent which cures by irradiating conventionally known energy ray such as gamma ray, electron beam, ultraviolet ray and visible light or so; however it is particularly preferable to use the ultraviolet ray curable type adhesive agent.

As for the energy ray curable adhesive agent, for example, the adhesive agent mixing the polyfunctional energy ray curing resin to the acrylic based adhesive agent may be mentioned. As the polyfunctional energy ray curing resin, the low molecular weight compound comprising plurality of functional group of energy ray polymerizable type, urethane acrylate oligomer or so may be mentioned. Also, the adhesive agent including the acrylic based copolymer comprising the energy ray polymerizable type functional group at the side chain can be used as well. As for such energy ray polymerizable functional group, (meth)acryloyl group is preferable.

In the present invention, the glass transition temperature (Tg) of the pressure sensitive adhesive agent layer is preferably −50° C. to 10° C., and preferably −25° C. to 5° C. In case the pressure sensitive adhesive agent layer is made of said acrylic based adhesive agent, the glass transition temperature of the pressure sensitive adhesive agent layer is regulated by the type and the polymerization ratio of the monomer constituting said acrylic based adhesive agent, and it can be regulated by estimating the influence of the ultraviolet curable compound or the crosslinking agent which is added depending on the case. Note that, the glass transition temperature (Tg) of the pressure sensitive adhesive agent layer is a peak temperature appearing on the measurement chart by the differential scanning calorimeters.

(The Sheet Having the Adhesive Resin Layer)

For the specific example of embodiment of the sheet having the adhesive resin layer of the present invention, first, the case of the sheet wherein the adhesive resin layer is the resin coat forming layer (the first sheet) will be described, then the production method of the semiconductor device using such sheet will be explained as well. Then, the case of the sheet wherein the adhesive resin layer is the pressure sensitive adhesive agent layer (the second sheet) will be explained.

(The First Sheet)

In regards with the first sheet, the method of forming the adhesive resin layer (the resin coat forming layer) is not particularly limited. For example, it is preferably formed by using the adhesive resin composition made by mixing the above mentioned components by appropriate ratio and in appropriate solvent. Specifically, the adhesive resin composition is obtained by coating and drying the adhesive resin composition on the base. Also, the adhesive resin composition may be coated and dried on the processing film different from the base to form a coat, and then this may be transferred on to the base. Note that, before using the sheet having the adhesive resin layer, in order to protect the adhesive resin layer, the release film may be laminated on the top face of the adhesive resin layer. As said release film, those coated with the release agent such as silicone resin or so to the plastic material such as polyethylenetelephthalate film and polypropylene film or so may be used.

Also, the adhesive resin layer may be stacked on the base via the re-releasable attaching layer. As the re-releasable attaching layer, those with weak adhesiveness having a adhesive force so that the adhesive resin layer can be released may be used, or those with the energy ray curable property which the adhesive force decreases by energy ray irradiation may be used. Also, in case of using the re-releasable attaching layer having the energy ray curable property, the energy ray irradiation is carried out in advance to the area where the adhesive resin layer will be laminated in order to reduce the tackiness, while other area is not carried out with the energy ray irradiation. For example, in order to adhere to the jigs or so, the tacky force may be maintained high. In order to not to carry out the energy ray irradiation to other area, for example the energy ray blocking layer may be provided by printing or so to the area corresponding to other area of the base, then the energy ray irradiation may be carried out from the base side. The re-releasable attaching layer can be formed by conventionally known various adhesive agents (for example, multipurpose adhesive agent such as rubber based, acrylic based, silicone based, urethane based, vinyletherbased or so). The thickness of the re-releasable attaching layer is not particularly limited, but usually it is 1 to 50 μm, and preferably 3 to 20 μm. The method for forming the re-releasable attaching layer on the base is the same as the method of forming the adhesive resin layer which was discussed in above.

Also, at the outer peripheral part of the surface of the adhesive resin layer, the tacky member of ring form (such as tacky tape or tacky agent layer or so) may be separately provided. The tacky tape may have a constitution of the tacky agent layer/the core (the one side tacky tape), or the constitution of the tacky agent layer/the core material/the tacky agent layer (the both side tacky tape). The tacky agent layer can be formed by the attaching agent used for the formation of the above mentioned re-releasable attaching layer. Also, the core material preferably comprises the heat resistance property, and it is preferable to use the above mentioned base as the core material.

The first sheet is made by forming the above mentioned adhesive resin layer on the base in a releasable manner. The shape of the sheet having the adhesive resin layer according to the present invention can be any shape such as a tape form, a label form or so.

(The Production Method of the Semiconductor Device Using the First Sheet)

The method of use of the first sheet will be explained using the case of using said sheet for the production of the semiconductor device.

First, the plate form member (for example, the semiconductor wafer or so) separated into a chip form component (for example a semiconductor chip or so) is adhered to the adhesive resin layer of the sheet having the adhesive resin layer, then the sheet is fixed to the ring frame.

As the plate form member, besides the semiconductor wafer, a luminescent element material plate form member, and the base placed on the semiconductor chip which is resin sealed or so may be mentioned. The semiconductor wafer may be silicon wafer, and also it may be a compound semiconductor wafer such as gallium arsenide. The circuit is formed on the surface of the semiconductor wafer, and the formation of the circuit can be carried out by various methods including the widely used etching method or lift off method or so. The circuit is usually formed in a lattice form at the inner peripheral surface of the semiconductor wafer. The thickness of the semiconductor wafer is not particularly limited, and usually it is 10 to 500 µm or so.

The method of separating the semiconductor wafer into the semiconductor chips is not particularly limited. As an example, when separating the wafer, a peripheral part of the dicing tape is fixed by a ring frame and dicing the wafer into chips by conventional means using a rotating blade of a dicer or so may be mentioned. Alternatively, it may be a dicing method of laser light. Also, it may be a pre-dicing method wherein grooves having a predetermined depth are formed from the surface side of the wafer, then separating the wafer by grinding from the backside of the wafer. Also, it may be a stealth dicing (registered trademark) wherein the modified area having an easily cleaved property by laser irradiation is provided to the part where the semiconductor wafer or so will be cut, then cutting and separating said modified area by dividing. The sheet having the adhesive resin layer is adhered to the plate form member which is separated into a chip form for example by transferring the semiconductor chip separated by the above mentioned method, onto the adhesive resin layer of the sheet having the adhesive resin layer, from the supporting body for chip form component processing such as dicing tape (the surface protection sheet in case of the pre-dicing). Here, in case the adhesive resin layer comprises the thermal bonding property, by allowing the adhesive resin layer to adhere firmly to the chip form component while applying a heat to the adhesive resin layer, the adhesive resin layer is firmly adhered to the chip form component. The heat is usually applied at 40 to 90° C. Also, when releasing the supporting body for chip form component processing, by releasing the adhesive resin layer from the chip form component while applying the heat, the tacky agent tends to withstand the rupture which is preferably used as the fixing means of the chip form component of the supporting body for chip form component processing; and the residue of the tacky agent to the chip form component scarcely occurs. The heat is usually applied at 40 to 90° C.

Next, in case the energy ray polymerizable compound is blended as the curable component (B) in the adhesive resin layer, the energy ray is irradiated to the adhesive resin layer from the base side, and the adhesive resin layer is cured preliminary to increase the cohesive force of the adhesive resin layer, thereby the adhesive force between the adhesive resin layer and the base may be lowered. Note that, the energy ray irradiation may be carried out at any step after the sheet is adhered to the chip form component and before the release (pickup) of the chip form component; and for example it may be carried out after the following described expanding step. Further, the energy ray irradiation may be carried by dividing into several times.

Next, by carrying out the expanding of the sheet having the adhesive resin layer, the space between the adjacent chip form components becomes wider, and the pickup of the chip form component can be carried out easily. The expanding is preferably carried out at the temperature of −15 to 5° C., at the speed of 5 to 600 mm/min. Thereby, the plasticity of the adhesive resin layer is lowered, and the adhesive resin layer at the part where should be cut by the expanding becomes less stretchable, thus the adhesive resin layer can be cut relatively easily. Due to the expanding, the adhesive resin layer is cut into approximately the same size as the chip form component, and also a shifting between the adhesive resin layer and the base occurs, thus the adhesive force between the adhesive resin layer and the base lowered, and the pickup property of the chip form component improves. By carrying out the pickup of the chip form component as such, the adhesive resin layer being cut can be released from the base while the adhesive resin layer is transferred to the backside of the chip form component.

Also, the adhesive resin layer may be cut by physical means such as laser or so prior to the expanding step. In case the adhesive resin layer is cut by the laser, the base may absorb the energy of the laser when the base is colored or so, thus in general, the laser is irradiated from the side contacting against the chip of the adhesive resin layer. In this case, if the chip has a poor alignment, there may be trouble during the laser irradiation. If the sheet having the adhesive resin layer of the present invention is used, even if it undergoes the heat treatment after it is adhered to the chip form component, particularly the heating treatment at the transferring step of the chip form component to the adhesive resin layer of the sheet having the adhesive resin layer from the supporting body for chip form component processing; the alignment of the chip is less likely to deteriorate.

Then, the chip form component is placed on the surface of other chip form component (the lower chip) or on the die pad part of the lead frame via the adhesive resin layer, then by adhering it, the semiconductor device can be produced (hereinafter, the die pad part or the lower chip surface where the chip form component is mounted will be referred as "the chip mounting part"). The chip mounting part may be applied with heat before the chip form component is mounted, or it may be applied with heat immediately after mounting it. The temperature of the heat applying is 80 to 200° C., and preferably 100 to 180° C. The heat applying time is usually 0.1 seconds to 5 minutes, and preferably 0.5 seconds to 3 minutes. The pressure when mounting is usually 1 kPa to 200 MPa.

After mounting the chip form component on the chip mounting part, the heat applying may be carried out depending on the needs. The heat applying condition at this time is within the range of the above mentioned heat applying temperature, and the heat applying time is 1 to 180 minutes, and preferably 10 to 120 minutes.

Also, the adhesive resin layer may be cured by temporarily adhering without carrying the heat applying treatment after the mounting, and by using the heat applying for the resin seal which is usually carried out for package production. By going through such process, the adhesive resin layer is cured, and the chip mounting part and the chip mounting part are firmly adhered to each other. The adhesive resin layer is fluidized under the die bonding condition, thus the roughness of the chip mounting part can be embedded sufficiently, and the void is prevented, thus the reliability of the package is enhanced.

In case such process is employed, when carrying out the wire bonding step, it is carried out after the chip form component is mounted on the chip mounting part and till the resin sealing step, however during this step, the adhesive resin layer is temporarily adhered, and it is uncured state but still having the curability of the adhesive resin layer. Thus, as mentioned in above, it is preferable that the adhesive resin layer have the thermal bonding property.

Also, the cured adhesive resin layer (the resin coat forming layer) may be used as the protection film forming layer for protecting the backside of the chip form component. That is, the chip form component (the chip form component having the protection film forming layer) released from the base while the adhesive resin layer being cut is transferred to the backside is mounted to the chip mounting part so that the surface of the chip form component and the chip mounting part faces against each other (a face down method). In this case, usually at the surface of the chip form component, the bumps (electrodes) are provided. For the mounting of the chip form component, a film form adhesive agent for die bonding or the fluidized adhesive agent composition are used separately.

(The Second Sheet)

In case the adhesive resin layer of the sheet having the adhesive resin layer is the pressure sensitive adhesive agent layer, the sheet having the adhesive resin layer is preferably used as the pickup sheet. The sheet having the adhesive resin layer of the present invention uses a special base mentioned in the above, thus it is excellent for maintaining the alignment of the chip in case surface protection sheet is released by applying a heat, and has excellent pickup aptitude and expanding aptitude. When the pickup sheet is adhered to the chip on the surface protection sheet, the pickup sheet comprises the adhesive force which can prevent the movement or falling of the chip caused by the releasing of the surface protection sheet. After the surface protection sheet is released, the chip on the pickup sheet is picked up. At this time, using the suction collet or so, the chip is picked up from the pickup sheet. Also, in case the pressure sensitive adhesive agent layer comprises the energy ray curability, the energy ray is irradiated to the pressure sensitive adhesive agent layer to lower the adhesive force thereby the pickup of the chip becomes easier. Also, when the chip is picked up, in order to space apart the chips against each other, it is preferable to expand the pickup sheet while the chip is fixed to the pickup sheet. By spacing apart the chips by expanding, the chips can be identified easier, and also the breakage caused by the contact of the between the chips can be reduced and the yield rate is improved as well.

(The Production Method of the Semiconductor Device Using the Second Sheet)

As similar to the first sheet, the method of using the second sheet will be explained. First, the plate form member separated into the chip form component aligned on the supporting body for the chip form component processing is adhered to the adhesive resin layer of the sheet having the adhesive resin layer. Next, the supporting body for the chip form component processing is released. By releasing the supporting body for the chip form component processing from the chip form component while applying a heat, the tacky agent preferably used as the fixing means of the chip form component of the supporting body for the chip form component processing tends to withstand the rupture. Thus, the residue of the tacky agent on the chip form component tends to occur scarcely. The heat is usually applied at 40 to 90° C. Then, the sheet is fixed to the ring flame.

By using the sheet having the adhesive resin layer of the present invention, even if it undergoes such heat applying treatment, the chip alignment is unlikely to deteriorate. Therefore, the collisions of the chip against each other are prevented, and also the malfunction of the pickup step due to the detection trouble of the chip component tends to occur less.

Next, the sheet having the adhesive resin layer according to the present invention is expanded depending on the needs, and the space between the chip form component is spaced apart.

Then, the chip form component is picked up. The pickup method of the chip form component is not particularly limited, and the pickup method using the suction collet may be mentioned.

As for the pickup method using the suction collet, the method wherein the releasing from the pressure sensitive adhesive agent layer of the chip component is facilitated by using the punching needle, then picking up by the suction collet may be mentioned. Also, pickup may be carried out by facilitating the releasing from the pressure sensitive adhesive agent layer of the chip form component by a slider using the die bonder, then picking up by suction collet.

The pickup by the suction collet is carried out specifically, by detecting the position of the chip form component by the sensor or so, then the suction collet is moved to left and right to determine the position to lower, thereby chip form component is suctioned separately and it is picked up.

After that, by going through the die bonding step (the mounting step) to the film carrier tape for the electronic component mounting such as TAB tape or so which is prepared separately, the semiconductor device is produced. Note that, in case the adhesive resin layer (the pressure sensitive adhesive agent layer) comprises the energy ray curable property, it is preferable to irradiate the energy ray to the adhesive resin layer from the base side before the pickup step to lower the tacky force of the adhesive resin layer to make the releasing of the chip easier.

EXAMPLE

Hereinafter, the present invention will be described in further detail using the examples; however the present invention is not to be limited thereto. Note that, in the example and comparative example, each evaluation was carried out follows.

<The Shrinkage of the Base>

The base was cut into 4.5 mm×15 mm width, and the thermal shrinkage was measured by the thermomechanical analysis apparatus (TMA4000SA made by Bruker Co., Ltd). The heat applying was carried out by pulling at 2 g of constant load and 70° C./1 min. Then the thermal shrinkage (%) was calculated by the below equation.

The thermal shrinkage=(the base length before the heat applying (15 mm)−the base length after the heat applying)/the base length before heat applying×100

<The Bending Resistance of the Base>

It was measured in accordance with 45° cantilever method described in JIS L1086:1983.

<The Young's Modulus of the Base>

The Young's modulus of the base was measured in accordance with JIS K7161:1994 using a universal tensile tester (TENSILON RTA-T-2M manufactured by ORIENTEC Co., LTD.), under the atmosphere of the humidity of 50% and the tension speed of 200 mm/min.

<The Thickness of the Base>

The thickness of the base was measured using the thickness gauge (PG-02 made by TECLOCK Corporation).

<The Chip Alignment>

(1) The Formation of the Chip Carried Out with the Pre-Dicing

The dicing device (DFD-6351, made by DISCO Corporation) was used to the silicon wafer having the diameter of 200 mm and thickness of 720 μm being mirror polished, and the wafer was formed with the groove having a cut depth of 70 μm and the chip size of 5 mm×5 mm.

Then, the surface protection sheet (Adwill E-3125KL made by Lintec Corporation) was adhered to the face formed with the groove.

Then, by using the backside grinding device (DGP-8760 made by DISCO Corporation), the backside grinding of the wafer was carried out till the thickness reached 50 μm to divide the wafer into a chip, thereby the chip group was obtained. The ultraviolet irradiation (illumination 220 mW/cm$^2$, and luminous energy 380 mJ/cm$^2$) was carried out to the surface protection sheet face thereof by using the ultraviolet ray irradiator (RAD-2000 m/12 made by Lintec Corporation).

(2) The Adhering of the Sheet Having the Adhesive Resin Layer and the Releasing of the Surface Protection Sheet First, the release film (heavy release type) was removed from the sheet having the adhesive resin layer produced in the examples and comparative examples.

Next, using the tape mounter (RAD2700F/12 made by Lintec Corporation), the adhesive resin layer of sheet having the adhesive resin layer contacts the chip so that it has the same concentric circle with the chip group, and it was adhered respectively so that the tacky member adheres to the ring frame. Here, the temperature of the suction table for fixing the chip was 50° C., so that the adhesive resin layer gets closer to the same temperature and softens.

Note that, when the sheet having the adhesive resin layer of the example 3 was adhered, it was carried out so that the re-releasable attaching layer contacts to the ring frame. Also, when the sheet having the adhesive resin layer of the example 4 was adhered, it was carried out so that the adhesive resin layer contacts with both of the ring frame and the chip, and the heat applying process to make the chuck table to be 50° C. was not carried out.

Next, the sheet having the adhesive resin layer adhered to the chip on the surface protection sheet and the ring frame was transferred to the release unit, and the surface protection sheet was released. Here, the temperature of the suction table for fixing the chip adhered with the sheet having the adhesive resin layer was 50° C., and the surface protection sheet was carried out with the heat applying release by making the temperature close thereto.

(3) Evaluation

Using the wafer alignment unit of the full cut laser device (DFL7160 made by DISCO Corporation), regarding the chips adjacent to each other in the scanning direction, the shifting distance in the scanning direction and the vertical direction were measured. The measuring interval was 5 mm interval in the scanning direction, and entire lines were measured then evaluated according to the following standards.

A (Good): the maximum value of the shifting distance is less than 15 μm.

B (Bad): the maximum value of the shifting distance is 15 μm or more.

<Expanding Property>

(1) Expanding at the Usual Temperature

The ultraviolet irradiation (illumination 220 mW/cm$^2$, and luminous energy 120 mJ/cm$^2$) was carried out by using the ultraviolet ray irradiator (RAD-2000m/12 made by Lintec Corporation) to the adhesive resin layer of the sheet having the adhesive resin layer adhered to the chip which was produced in the above mentioned <the chip alignment> from the base side. Then, the adhesive resin layer was cut using the full cut laser (DFL7160 made by DISCO Corporation).

Next, using the expanding device (ME-300 series made by JCM Co., Ltd.), the sheet having the adhesive resin layer adhered with the chip was expanded under the condition of temperature of 23° C., expanding speed of 50 mm/sec, and the expanding amount of 6 mm. If the sheet was able to expand, then it was evaluated as "A", and if it was unable then it was evaluated "B".

Note that, for those having the evaluation of the chip alignment of B, and also having malfunction during the cutting of the adhesive resin layer by the laser saw, no evaluation was carried out.

(2) The Cool Expanding

The ultraviolet irradiation (illumination 220 mW/cm$^2$, and luminous energy 120 mJ/cm$^2$) was carried out by using the ultraviolet ray irradiator (RAD-2000m/12 made by Lintec Corporation) to the adhesive resin layer adhered with the chip which was produced in the above mentioned <the chip alignment> from the base side. Then, using the die separator (DDS2300 made by DISCO Corporation), the sheet having the adhesive resin layer adhered with the chip was expanded under the condition of temperature of 0° C., expanding speed of 200 mm/sec, and the expanding amount of 6 mm. If the sheet was able to expand by expanding, then it was evaluated as "A", and if it was unable then it was evaluated "B".

<The Pickup Property>

From the sheet having the adhesive resin layer adhered with the chip after carried out with the evaluation of the expanding at usual temperature as mentioned in the above, the pickup was done by die bonder (Bestem-D02, made by Canon Machinery Inc.). As for the pickup property, if the pickup of the chip was carried out from the base without chip crack or chip breakage, then it was evaluated "A"; if the chip crack or the chip breakage occurred during the pickup, then it was evaluated "B"; and if the pickup was unable due to the chip crack or the chip breakage during the pickup, then it was evaluated as "C". The same method was carried out when the evaluation of above mentioned (2) the cool expanding was carried out to evaluate the pickup property.

Note that, for those having the evaluation of the chip alignment of B, and also having malfunction during the cutting of the adhesive resin layer by the laser saw, this evaluation was carried out only for those which were able to expand.

<The Adhesive Resin Composition>

(A) Binder polymer component: 100 parts by weight of the acrylic polymer comprising 55 parts by weight of n-butyl acrylate, 10 parts by weight of methyl acrylate, 20 parts by weight of glycidyl methacrylate, and 15 parts by weight of 2-hydroxyethylacrylate (the weight average molecular weight: 900,000, the glass transition temperature: −28° C.)

(B-1) Solid epoxy resin: 330 parts by weight of polyfunctional epoxy resin (EPPN-502H made by Nippon Kayaku Co., Ltd.)

(B-2) Liquid form epoxy resin: 330 parts by weight of bisphenol A type epoxy resin comprising 20 wt % of acrylic particle (ACRYSET BPA328 made by NIPPON SHOKUBAI CO., LTD)

(B-3) Curing agent: 300 parts by weight of novolac type phenol resin (Shonol BRG-556 made by SHOWA DENKO K.K.)

(B-4) Energy ray polymerizable compound: 150 parts by weight of dicyclopentadienemethoxydiacrylate (KAYARAD R-684 made by Nippon Kayaku Co., Ltd.)

(D) Heat curing catalyst: 1 parts by weight of imidazole (Curezol 2PHZ made by SHIKOKU CHEMICAL CORPORATION)

(E) Silane coupling agent: 15 parts by weight (MKC silicate MSEP2 made by Mitsubishi Chemical Corporation)

(F) Photopolymerization initiator: 5 parts by weight of α-hydroxycyclohexylphenyl ketone (IRGACURE 184 made by Ciba Specialty Chemicals)

(G) Inorganic filler: 200 parts by weight of ADMAFINE SC2050 made by Admatechs.

Example 1

The above mentioned components of the adhesive resin component were blended in the above mentioned amount. Also, as the release film, polyethylene terephthalate film (SP-P502010, the thickness of 50 μm made by Lintec Corporation) carried out with the release treatment on the one side was prepared.

As the base, the multilayered laminate comprising the layer of low density polyethylene (NOVATEC-LC520 (density: 0.923 g/cm$^3$, MFR: 3.6 g/10 min, the thickness: 8 μm) made by Japan Polychem Corporation), the layer of polypropylene (the mixture of homopolypropylene resin (Prime Polypro F-300SP (density: 0.90 g/cm$^3$, MFR: 3.0 g/10 min) made by Prime Polymer Co., Ltd) and the styrene-ethylenebutylne-styrene block copolymer (DYNARON 8601P (density: 0.89 g/cm$^3$, MFR: 3.5 g/10 min) made by JSR Corporation), and the layer of low density polyethylene (it is the same as mentioned in above except that the thickness is 12 μm).

Note that, the source resin of the MFR is measured at the temperature of 190° C. (polyethylene based resin), 230° C. (polypropylene based resin), or the temperature of 230° C. (styrene-butadiene copolymer hydrogenated additives), and at the load of 21.18N which are in accordance with JIS K7210:1999.

On the above mentioned release film, the methlethylketone solution (the solid concentration of 61 wt %) of the above mentioned adhesive resin composition was coated so that the thickness after the drying becomes 20 μm. Then, it was dried (the drying condition: 100° C. for 3 minutes in the oven), thereby the adhesive resin layer was formed on the release film. The above mentioned adhesive resin layer was adhered to the side of the low density polyethylene density having the thickness of 8 μm of the base; then the release film was removed. Thereby the adhesive resin layer was formed on the base, and the sheet having the adhesive resin layer was obtained.

Also, as the core material, the same multilayered laminate as the above mentioned base was prepared. The acrylic based adhesive agent (PA-T1 made by Lintec Corporation) of the strong adhesive type was coated and dried on the release treated face of the release film (Product name SP-PET 3801, the thickness of 38 μm made by Lintec Corporation) of the easy release type, so that the dried thickness is 5 μm, thereby the one sided adhesive tape was obtained by adhering with the above mentioned core material.

100 parts by weight of acrylic based adhesive agent (copolymer between n-butyl acrylate and acrylic acid (n-butyl acrylate/acrylic acid=90/10 (weight ratio), the weight average molecular weight: 600,000, the glass transition temperature: −44° C.)), 200 parts by weight of urethaneacrylate oligomer having the molecular weight of 7000, 10 parts by weight of the crosslinking agent (isocyanate based) and 10 parts by weight of energy ray curing reaction initiator (benzophenone based) were mixed to form the energy ray curable adhesive agent composition.

Next, the above mentioned energy ray curable adhesive composition was coated on the face of the release film (Product name SP-PET 3811, the thickness of 38 μm made by Lintec Corporation) of the lightly release type, and dried (90° C. for 1 minute) to obtain the energy ray curable adhesive agent layer with the thickness of 5 μm; thereby the both sided adhesive tape was produced by adhering to the core material side of the above mentioned one sided adhesive tape.

The layer from the release film of the both sided adhesive tape to the energy ray curable adhesive agent layer was cut out into a circular shape having the diameter of 220 mm while leaving only the release film (the heavy release type), then this circular shape portion was removed. Next, the release film (the easy release type) of the outer peripheral of the circular portion was released; then the acrylic based adhesive agent face of the strong adhesive type which is exposed was adhered to the adhesive resin layer of the sheet having the adhesive resin layer of the above mentioned.

Then, the layer from the base to the energy ray curable adhesive agent layer was cut out into a circular shape having the diameter of 270 mm while leaving only the release film (the easy release type) so that it is the concentric circle with the circular portion which has been cut out in advance, then this outer peripheral part was removed. Thereby, the tacky member having the width of 25 mm was provided to the outer peripheral part of the sheet having the adhesive resin layer. Each evaluation was carried out using this sheet having the adhesive resin layer. Note that, the adhesive resin layer does not have the pressure sensitive adhesive property under usual temperature, and for the purpose to make a comparison, the adhesive resin layer was adhered to the chip without the heat applying at the same condition as the evaluation for <the chip alignment>; then the surface protection sheet was unable to be released since the adhesive resin layer did not adhere to the chip.

Example 2

The sheet having the adhesive resin layer provided with the tacky member at the outer peripheral was produced as same as the example 1; except that the vinyl chloride film (the thickness: 80 μm) was used as the core material. The results are shown in Table 1.

Example 3

With respect to 100 parts by weight of acrylic adhesive agent (the copolymer of having the monomers of n-butyl acrylate, 2-ethylhexyl acrylate, and 2-hydroxyethylacrylate, the weight average molecular weight: 900,000, the glass transition temperature: −59° C.), 20 parts by weight of aromatic polyisocyanate (CORONATE L made by NIPPON POLYURETHANE INDUSTRY CO., LTD) was blended; thereby the re-releasable attaching agent composition was obtained.

Methylethylketone solution (the solid portion concentration of 30 wt %) of the above mentioned re-releasable tacky agent composition was coated on the release film (SP-PET 38101 made by Lintec Corporation) so that the thickness after drying is 10 μm; then it was dried (the drying condition: 100° C. for 1 minute in oven); and it was adhered to the side of the low density polyethylene having the thickness of 8 μm of the base as similar to example 1, thereby the re-releasable attaching layer was formed, then the release film was removed.

On the release film (SP-PET 3811 made by Lintec Corporation), methylethylketone solution of the above mentioned adhesive resin composition (the solid concentration of 61 wt %) was coated so that the thickness after the drying was 20 μm, then it was dried (the drying condition: 100° C. for 1 minute in oven); thereby the adhesive resin layer was formed on the release film, followed by adhering with other release film (SP-PET 3801 made by Lintec Corporation). Next, other release film and the adhesive resin layer was cutout in a circular shape having the diameter of 200 mm leaving the release film (the above mentioned SP-PET 3811). Other release film of the outer peripheral portion and the adhesive resin layer were removed while leaving the circular shape. After removing other release film of the circular portion, and exposing the adhesive resin layer of the circular portion, the re-releasable attaching layer on the base produced as in above was adhered thereto. Then, the base and the re-releasable attaching layer were cut out in a circular shape having the diameter of 222 mm leaving the release film. At the end, the release film was removed and the sheet having the adhesive resin layer was obtained. The results are shown in Table 1.

Example 4

100 parts by weight of acrylic based adhesive agent (copolymer between n-butyl acrylate and acrylic acid (n-butyl acrylate/acrylic acid=90/10 (weight ratio), the weight average molecular weight: 600,000, the glass transition temperature: −44° C.)), 200 parts by weight of urethaneacrylate oligomer having the molecular weight of 7000, 10 parts by weight of the crosslinking agent (isocyanate based) and 10 parts by weight of energy ray curing reaction initiator (benzophenone based) were mixed to form the energy ray curable pressure sensitive adhesive agent composition. To this release film (SP-PET 381031 made by Lintec Corporation), this composition was coated so that the thickness after drying is 10 μm, and the heat drying at 90° C. for 1 minute was carried out to form the pressure sensitive adhesive agent layer. The pressure sensitive adhesive agent layer on the release film was adhered to the side of the low density polyethylene density having the thickness of 8 μm of the base as similar to example 1, and the release film was removed. Thereby the sheet having the adhesive resin layer (the adhesive sheet) wherein the adhesive rein layer is the pressure sensitive adhesive agent layer was obtained. The results are shown in Table 1.

Example 5

The sheet having the adhesive resin layer provided with the tacky member at the outer peripheral was produced as same as the example 1; except that the multilayered laminate comprising the layer of low density polyethylene (NOVATEC-LC520 (density: 0.923 g/cm$^3$, MFR: 3.6 g/10 min, the thickness: 10 μm) made by Japan Polychem Corporation), the layer of polypropylene (the mixture of homopolypropylene resin (Prime Polypro F-300SP (density: 0.90 g/cm$^3$, MFR: 3.0 g/10 min) made by Prime Polymer Co., Ltd): the styrene-ethylenebutylne-styrene block copolymer (DYNARON 8601P (density: 0.89 g/cm$^3$, MFR: 3.5 g/10 min) made by JSR Corporation)=70:30 (weight ratio), the thickness: 80 μm), and the layer of low density polyethylene (same as the above) as the base and the core material. The results are shown in Table 1.

Comparative Example 1

The sheet having the adhesive resin layer provided with the tacky member at the outer peripheral was produced as same as the example 2 except for using the polypropylene film (the thickness: 100 μm, Young's modulus: 500 MPa) as the base. The results are shown in Table 1.

Comparative Example 2

The sheet having the adhesive resin layer provided with the tacky member at the outer peripheral was produced as same as the example 2; except for using the low density polyethylene film (the thickness: 100 μm, Young's modulus: 150 MPa) as the base. The results are shown in Table 1.

Comparative Example 3

The sheet having the adhesive resin layer provided with the tacky member at the outer peripheral was produced as same as the example 2; except for using polyterephthalate film (the thickness: 100 μm, Young's modulus: 4000 MPa) as the base. The results are shown in Table 1.

Comparative Example 4

The sheet having the adhesive resin layer provided with the tacky member at the outer peripheral was produced as same as the example 2; except for using ethylene-methacrylic acid copolymer film (the thickness: 80 μm, Young's modulus: 120 MPa) as the base. The results are shown in Table 1.

TABLE 1

| | Base | | | | | | | Expanding property | | Pickup property | |
|---|---|---|---|---|---|---|---|---|---|---|---|
| | Shrinkage (%) | | Bending | Young's | | Young's modulus × | | | | | |
| | MD direction | CD direction | resistance (mm) | modulus (MPa) | Thickness (μm) | Thickness (N/m) | Chip alignment | Condition (1) | Condition (2) | Condition (1) | Condition (2) |
| Example 1 | −0.3 | 0.17 | 97 | 400 | 80 | 3.2 × 10$^4$ | A | A | A | A | A |
| Example 2 | −0.3 | 0.17 | 97 | 400 | 80 | 3.2 × 10$^4$ | A | A | A | A | A |
| Example 3 | −0.3 | 0.17 | 97 | 400 | 80 | 3.2 × 10$^4$ | A | A | A | A | A |
| Example 4 | −0.3 | 0.17 | 97 | 400 | 80 | 3.2 × 10$^4$ | A | A | A | A | A |
| Example 5 | −0.3 | 0.5 | 85 | 260 | 100 | 2.6 × 10$^4$ | A | A | A | A | A |
| Comparative example 1 | −0.5 | 0.4 | 70 | 500 | 100 | 5.0 × 10$^4$ | A | B | A | — | B |
| Comparative example 2 | −1 | 0.5 | 105 | 150 | 100 | 1.5 × 10$^4$ | B | — | A | — | A |

TABLE 1-continued

| | Base | | | | | | | Expanding property | | Pickup property | |
|---|---|---|---|---|---|---|---|---|---|---|---|
| | Shrinkage (%) | | Bending resistance (mm) | Young's modulus (MPa) | Thickness (μm) | Young's modulus × Thickness (N/m) | Chip alignment | Condition (1) | Condition (2) | Condition (1) | Condition (2) |
| | MD direction | CD direction | | | | | | | | | |
| Comparative example 3 | −0.1 | 0.05 | 30 | 4000 | 100 | $4.0 \times 10^5$ | A | B | B | — | — |
| Comparative example 4 | −1.5 | 1.5 | 111 | 120 | 80 | $9.6 \times 10^3$ | B | — | A | — | A |

The invention claimed is:

1. A sheet having an adhesive resin layer, comprising:
a base comprising a multilayered laminate comprising a low density polyethylene film and a polypropylene film; and
the adhesive resin layer comprising a resin coat forming layer stacked on said base, wherein:
a shrinkage of the base in MD direction and CD direction after one minute heat applying at 70° C. is −0.5 to 0.5%,
a bending resistance of the base is 80 mm or more,
the resin coat forming layer has a thermal bonding property and does not have pressure-sensitive adhesiveness at a temperature of 23° C., and
the resin coat forming layer comprising a binder polymer component (A) including an acrylic polymer and a curable component (B).

2. The sheet having the adhesive resin layer as set forth in claim 1, wherein a product between Young's modulus of the base and the thickness of the base is $1.0 \times 10^5$ N/m or less.

3. The sheet having the adhesive resin layer as set forth in claim 1, wherein the multilayered laminate comprises the low density polyethylene film, the polypropylene film, and a low density polyethylene film, stacked in this order.

4. The sheet having the adhesive resin layer as set forth in claim 1, wherein the resin coat forming layer is stacked on the base via a re-releasable attaching layer.

5. The sheet having the adhesive resin layer as set forth in claim 1, wherein the binder polymer component (A) further comprises a polyester resin, urethane resin, silicone resin, phenoxy resin, or a rubber-based polymer.

6. The sheet having the adhesive resin layer as set forth in claim 1, wherein the curable component (B) comprises a thermosetting component.

7. The sheet having the adhesive resin layer as set forth in claim 6, wherein the thermosetting component comprises an epoxy resin.

8. The sheet having the adhesive resin layer as set forth in claim 1, wherein the polypropylene film comprises a softening component comprising a vinyl aromatic hydrocarbon-conjugated diene hydrocarbon copolymer.

9. The sheet having the adhesive resin layer as set forth in claim 8, wherein a content of the softening component in the polypropylene film is 10 to 30 wt %.

10. The sheet having the adhesive resin layer as set forth in claim 1, wherein said polypropylene film comprises a softening component comprising a hydrogenated product of a vinyl aromatic hydrocarbon-conjugated diene hydrocarbon copolymer.

11. The sheet having the adhesive resin layer as set forth in claim 1, wherein the acrylic polymer comprises an alkly (meth)acrylate monomer having an alkyl group of 1-18 carbon atoms.

12. A production method of a semiconductor device comprising;
a step of adhering a chip form component to the adhesive resin layer of the sheet having the adhesive resin layer as set forth in claim 1, and
a step of picking up the chip form component.

13. A production method of a semiconductor wafer comprising;
a step of adhering a chip form component to the adhesive resin layer of the sheet having the adhesive resin layer as set forth in claim 1,
a step of releasing the adhesive resin layer from the base while transferring the adhesive resin layer to a backside of the chip form component, and
a step of placing the chip form component on a die pad part or on the surface of another chip form component via the adhesive resin layer.

* * * * *